(12) United States Patent
Melanson et al.

(10) Patent No.: US 6,501,692 B1
(45) Date of Patent: Dec. 31, 2002

(54) CIRCUIT AND METHOD FOR STRESS TESTING A STATIC RANDOM ACCESS MEMORY (SRAM) DEVICE

(75) Inventors: John L. Melanson, Austin, TX (US); Dimitris Pantelakis, Austin, TX (US); Robert A. Jensen, Austin, TX (US); Vikram Shenoy, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/953,767

(22) Filed: Sep. 17, 2001

(51) Int. Cl.$^7$ .................................................. G11C 7/00
(52) U.S. Cl. ....................................... 365/201; 365/154
(58) Field of Search ................................ 365/201, 154, 365/156, 203, 204

(56) References Cited

U.S. PATENT DOCUMENTS

| | | | | |
|---|---|---|---|---|
| 5,255,230 A | * | 10/1993 | Chan et al. ................. | 365/201 |
| 5,361,232 A | * | 11/1994 | Petschauer et al. ......... | 365/201 |
| 5,559,745 A | * | 9/1996 | Banik et al. ................ | 365/201 |
| 6,256,241 B1 | * | 7/2001 | Mehalel ...................... | 365/201 |

* cited by examiner

Primary Examiner—Richard Elms
Assistant Examiner—Anh Phung
(74) Attorney, Agent, or Firm—Steven Lin, Esq.

(57) ABSTRACT

A stress test circuit and method for static random access memory ("SRAM") cells of an SRAM device are disclosed. The stress test component has a resistance element and a switch component to electrically couple the resistance element between a bit line and complementary bit line of an SRAM cell storing a digital value. Stress test component is activated to electrically couple the resistance element to the bit line and complementary bit line. An electrical path is created causing a voltage on an SRAM circuit path maintaining the digital value to be pulled in one direction by a stress current. The electrical path causes another voltage on another SRAM circuit path maintaining a complementary digital value to be pulled in an opposite direction by the stress current. The SRAM cell is then read to determine whether the digital value has changed state.

36 Claims, 9 Drawing Sheets

CIRCUIT AND METHOD FOR STRESS TESTING A STATIC RANDOM ACCESS MEMORY (SRAM) DEVICE

BACKGROUND OF THE INVENTION

1. Field of the Invention

The present invention relates to the field of memory devices in integrated circuits, and more particularly, the present invention relates to circuits and method for testing memory cells in such memory devices. More specifically, the present invention relates to a method and circuit for stress testing a memory cell of a static random access memory (SRAM) device.

2. Description of Related Art

A typical static random access memory (SRAM) circuit has arrays of memory cells that include word lines, a read/write circuit coupled to each array, and an access control circuit. The read/write circuit provides the capability of writing data or bit values to each memory cell. The access control circuit drives a plurality of word lines to perform read and write operations. Each memory cell has a pair of cross-coupled inverters that are utilized to store a digital value (e.g., a high value or a low value). For a memory cell of the SRAM circuit, a circuit path along one of the cross-coupled inverters holds the digital value and typically includes a first p-type transistor, a first n-type transistor, and a first pass-gate transistor. Another circuit path along another one of the cross-coupled inverters usually holds the complementary digital value and has a second p-type transistor, a second n-type transistor, and a second pass-gate transistor. The pass gate transistors are used to couple the two cross-coupled inverters to a bit line and a complementary bit line of the SRAM cell. Therefore, one SRAM circuit path generally maintains the digital value while another SRAM circuit path generally maintains the complementary digital value.

The SRAM circuit is generally made as an integrated circuit (IC) according to an integrated circuit process. The IC process involves the formation of semiconductor and metal structures for the SRAM circuit. Diffusion regions and polysilicon structures within the semiconductor structures typically form the transistors of the SRAM circuit. Metal structures are utilized to provide electrical connections between the transistors and other components of the SRAM circuit. The typical IC process involves the formation of numerous electrical contacts for each memory cell, and the contacts may be formed where diffusion regions, polysilicon structures, metal interconnecting structures, and/or vias of the transistors meet.

However, the typical IC involves defects occurring in the semiconductor and metal structures during the IC manufacturing and fabrication process. For example, the defects in IC fabrication process may exist and cause "weak" contacts or failures in the memory cells or in the individual transistors of the memory cells. Two types of defects generally exist for a memory cell: a symmetric defect or an asymmetric defect. A symmetric defect impairs the performance of the pair of cross-coupled inverters of a memory cell while an asymmetric defect impairs only one of the cross-coupled inverters. For example, a defective contact in a power supply line, which supplies power to the entire memory cell, is considered a symmetric defect since the pair of cross-coupled inverters is denied power. A defect in a p-transistor within one of the cross-coupled inverters is an example of an asymmetric defect since the defect only affects one of the cross-coupled inverters.

Various testing procedures exist to test the quality of the IC and to detect defects in the IC with the SRAM circuit. One such test is to place the IC having the SRAM circuit into a specialized IC tester. The IC tester writes data into the SRAM circuit and immediately reads the data therefrom to verify the data stored therein. If the data read from the SRAM circuit does not match the data written to the SRAM circuit, then the SRAM circuit is deemed defective. This type of test procedure, however, does not detect manufacturing defects of the memory cell that cause data retention problems that occur over a relatively long period of time. For example, a memory cell for the SRAM device having a defective p-transistor within one of the cross-coupled inverters may be able to retain a high voltage value for only a short time period. The high voltage maintained at the nodes of the memory cell would discharge through diffusion regions of the transistors of the memory cell. A defective p-transistor would then be able to maintain the high voltage for a short time period but would not be able to maintain the high voltage level for a long period of time.

One known way of detecting such data retention defects is to provide the IC tester with a delay that is long enough to allow such a defective memory cell to discharge. However, the time between when the IC tester writes the data and reads the data is increased so that the data retention defects are detectable. Such delays significantly increase the testing time of each IC. Multiple IC testers would then have to be used in parallel to decrease the overall testing time of all the ICs, but the use of multiple IC testers, which are relatively expensive, increase the overall costs of manufacturing and testing the ICs with SRAM devices.

Another prior art method of testing ICs having SRAM circuits involves coupling a "weak write" test circuit to each array of memory cells. The "weak write" test generally involves using a separate test circuit for applying a predetermined voltage amount to the memory cell to test the existence of excess resistance or leakage within the transistors and transistor paths of the memory cell. The predetermined voltage amount is set at a value in which the applied voltage will not affect the value of a good memory cell but will change the value of a defective memory cell. U.S. Pat. No. 5,559,745 to Banik et al. ("Banik") assigned to Intel Corporation, Santa Clara, Calif., discloses such an exemplary "weak write" circuit and method.

Figure 1:
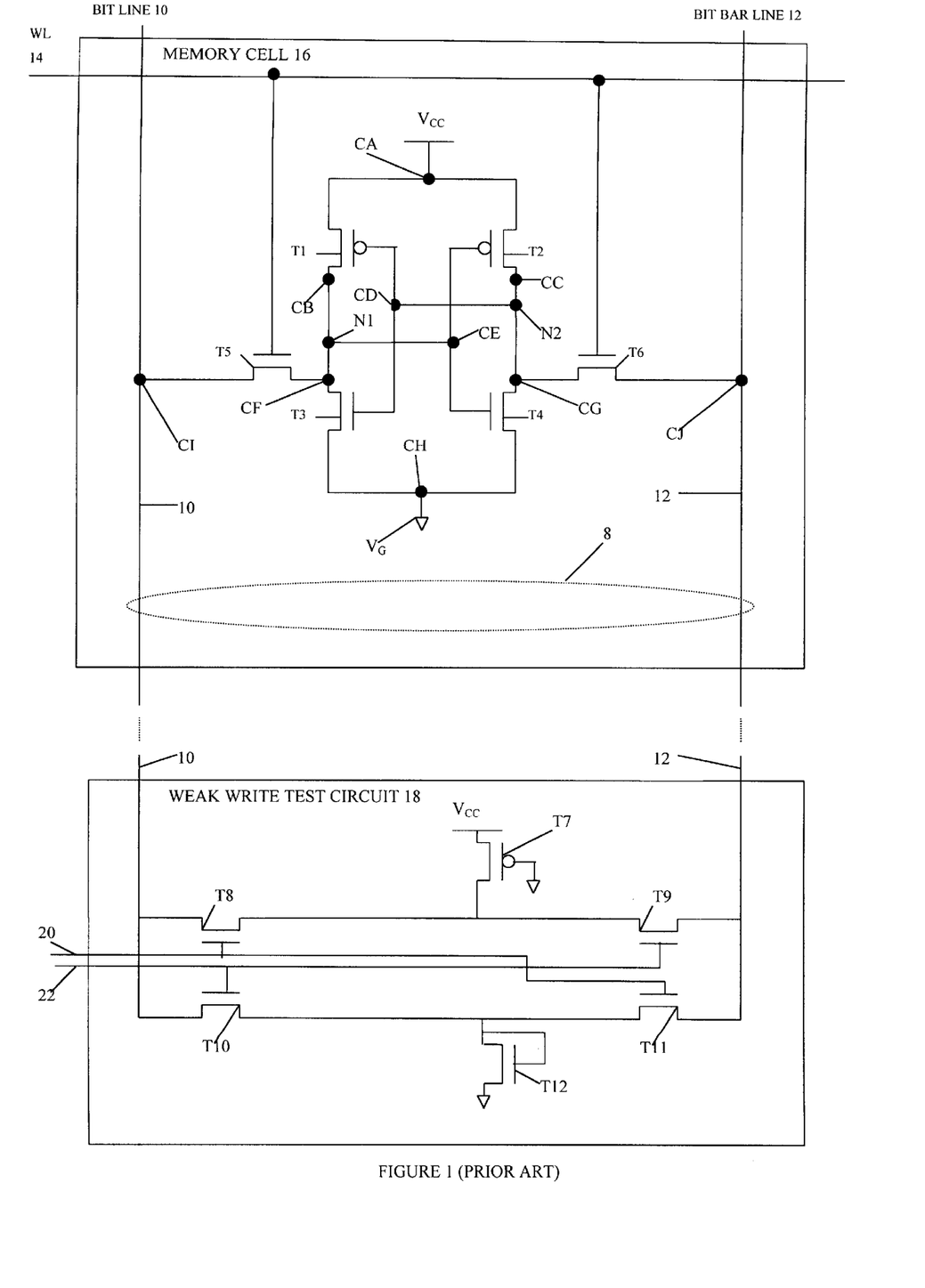
FIG. 1 is an exemplary circuit diagram of a memory cell and a "weak write" test circuit according to the prior art.

Prior art FIG. 1 shows a memory cell 16 being tested by a "weak write" test circuit 18 according to Banik. Memory cell 16 is a typical SRAM cell that includes a plurality of transistors T1 to T6 configured in a manner to form cross-coupled inverters as shown in prior art FIG. 1. Fabrication defects in the transistor(s) or along the transistor path(s) may reduce the strength of pull-up p-type transistors T1 and T2 and/or the pull-down n-type transistors T3 and T4, and these defects are a potential source of data retention defects. Other types of fabrication defects are from leakage paths at node N1 and/or node N2, which may also be potential sources of data retention defects. Bit line pair 8 consists of a bit line 10 and a complementary bit line, bit bar line 12, as shown in prior art FIG. 1. Transistor T5 is a pass gate transistor, which couples a node NI to bit line 10. Transistor T5 is also coupled to word line ("WL") 14. Similarly, the transistor T6 is another pass gate transistor that connects a node N2 to bit bar line 12. Transistor T6 is also coupled to word line ("WL") 14. Transistors T5 and T6 and, in turn, memory cell 16 are activated by word line 14.

Various contacts, such as contacts CA to CJ, exist in circuit paths of memory cell 16. Defects may exist or be generated from contacts, such as contacts CA to CJ, in memory cell 16. Defective contacts may result in the necessary or proper connection not being provided between the integrated circuit structures or may provide a highly resistive connection compared to other contacts. The lack of proper connections and/or the existence of highly resistive connections may cause long-term data retention problems for memory cell 16.

"Weak write" test circuit 18 requires the passing of two separate tests in order to verify whether memory cell 16 is not defective. The first test is the weak writing of a zero ("0") digital value into memory cell 16. A one ("1") digital value is first written into memory cell 16. "Weak write" test circuit 18 is then activated to attempt to weak write a zero ("0") digital value into memory cell 16. The digital value of memory cell 16 is thereafter read to determine whether or not the one ("1") digital value has flipped to the zero ("0") value. The second test is the weak writing of a one ("1") into memory cell 16. A zero ("0") digital value is first written into memory cell 16. "Weak write" test circuit 18 is activated to attempt to weak write a one ("1") digital value into memory cell 16. The digital value of memory cell 16 is thereafter read to determine whether or not the zero ("0") digital value has flipped to the one ("1") digital value.

If the digital value of memory cell 16 and bit line 10 for memory cell 16 are of high values, then a first set of components in "weak write" test circuit 18 includes transistors for performing the "weak write" zero test. The first set of components includes at least a discharging transistor T8 coupled to bit line 10 and a charging transistor T11 coupled to complementary bit line 12. A first test control line 20 is required to provide the signal for activating the first set of components. However, if the digital value of memory cell 16 and bit line 10 for memory cell 16 are of low values, then the second set of components in "weak write" test circuit 18 includes transistors for performing the "weak write" one test. This second set of components includes at least a charging transistor T10 coupled to bit line 10 and a discharging transistor T9 coupled to complementary bit line 12. A second test control line 22 is also required to provide the signal for activating the second set of components. As shown in prior art FIG. 1, two generally different sets of components (e.g., transistor set that includes transistors T8 and T11 and transistor set that includes transistors T9 and T10) and two respective test control lines 20 and 22 are required to perform the two separate tests. Each of the two different sets of components includes at least a transistor for charging a bit line and another transistor for discharging the other respective bit line.

One disadvantage of "weak write" circuit 18 and the "weak write" method is that they require driving currents to be carefully matched to memory cell 16. If the currents are not carefully matched and "weak write" circuit 18 and method overdrive memory cell 16 when "weak writing" it, then memory cell 16 may be erroneously detected as defective and unnecessarily thrown out. On the other hand, if "weak write" circuit 18 and method underdrive memory cell 16 when "weak writing" it, then memory cell 16 may be erroneously passed as a good cell when, in fact, it is a defective cell.

Another disadvantage of "weak write" circuit 18 and method is that they require the use of two sets of components and two respective test control lines to perform both the "weak write" zero test and the "weak write" one test. The use of two sets of components and two test control lines add to the overall space and cost of the memory device. Also, utilization of additional components, transistors, and test control lines add to the complexity of the circuit design and increase the possibilities of circuit errors and problems. The use and management of two sets of components also become complicated. The two tests (e.g., "weak write" zero test and the "weak write" one test) both need to be done, but individual and separate execution is required for each of the two tests. "Weak write" circuit 18 and method have the shortcoming of not being able to automatically identify or self determine which test (e.g., "weak write" zero test or "weak write" one test) is to be performed and executed.

A further prior art method for testing ICs with SRAM circuits is to couple a transistor to each and every bit line of a memory cell. The transistor is activated to pull-down the voltage level on a high bit line. However, this method also requires the use of many additional transistors (e.g., one transistor for each bit line). Each transistor also requires driving currents to be carefully matched to the memory cell or device. If the currents are not carefully matched and the transistor overdrives the memory cell during the test, then the memory cell may be erroneously detected as defective and unnecessarily thrown out. On the other hand, if the transistor underdrives the memory cell during the test, then the memory cell may be erroneously passed as a good cell when, in fact, it is a defective cell. The additional transistors substantially add to the space and cost of the memory device. Also, the manner for controlling and activating the transistors becomes necessary and complex in that logic or methodology must be implemented to determine which transistors are to be activated at which times and/or under which conditions. The transistors are also not configured in a manner to automatically identify or self determine when to activate to perform the appropriate test.

The present invention recognizes the desire and need for a memory test circuit, which does not have to carefully match driving currents to the memory cell or device. The present invention also recognizes the desire or need for a memory test circuit which is simple in design and requires a minimal number of components. The use of less components minimizes the overall space and cost of the memory device and reduces the complexity of the circuit design, which lowers the possibilities of circuit errors and problems. The present invention further recognizes the need or desire for the memory test circuit automatically identifying or self-determining which test (e.g., write test zero or write test one) is to be executed and performed. Automatic identification or self determination of the appropriate test would eliminate or minimize the logic, methodology, or programmed/manual control for having to determine which test is to be executed. The present invention overcomes the problems and disadvantages in accordance with the prior art.

SUMMARY OF THE INVENTION

A stress test circuit and method for static random access memory ("SRAM") cells of an SRAM device are disclosed. The stress test component has a resistance element and a switch component to electrically couple the resistance element between a bit line and complementary bit line of an SRAM cell storing a digital value. Stress test component is activated to electrically couple the resistance element to the bit line and complementary bit line. An electrical path is created causing a voltage on an SRAM circuit path maintaining the digital value to be pulled in one direction by a stress current. The electrical path causes another voltage on another SRAM circuit path maintaining a complementary digital value to be pulled in an opposite direction by the stress current. The SRAM cell is then read to determine whether the digital value has changed state.

An object and advantage of the present invention is to provide a stress test circuit for memory cells (e.g., SRAM cells) of a memory device (e.g., a SRAM device) in which the stress test circuit includes a stress test component having a resistance element and a switch component to electrically couple the resistance element between a bit line and a complementary bit line both driven by a word line of an SRAM cell storing a digital value written therein and the stress test circuit creates an electrical path causing a defective memory cell to change in value.

An aspect and advantage of the present invention is to provide a stress test component that is a transistor coupled to the bit line, the complementary bit line, and a stress control voltage for controlling activation of the stress test component.

Another aspect and advantage of the present invention is that the memory cell may be a multi-port cell and the memory cell includes two cross-coupled inverters wherein a first one of the two cross-coupled inverters has a first p-type transistor/a first resistor and a first n-type transistor and a second one of the two cross-coupled inverters has a second p-type transistor/a second resistor and a second n-type transistor; a pass-gate transistor that couples a node between the first p-type transistor/first resistor and the first n-type transistor to the bit line; and another pass-gate transistor that couples another node between the second p-type transistor/second resistor and the second n-type transistor to the complementary bit line.

A further aspect and advantage of the present invention is that when the digital value is a high value and the complementary digital value is a low value, a voltage on a SRAM circuit path defined by the first p-type transistor/first resistor, the first n-type transistor, and the pass-gate transistor is pulled down by a stress current and another voltage on another SRAM circuit path defined by the second p-type transistor/second resistor, the second n-type transistor, and the another pass-gate transistor is pulled up by the stress current to test whether a defect in the SRAM cell exists to change the digital value of the SRAM cell to the opposite value.

A still further aspect and advantage of the present invention is that when the digital value is a low value and the complementary digital value is a high value, a voltage on a SRAM circuit path defined by the first p-type transistor/first resistor, the first n-type transistor, and the pass-gate transistor is pulled up by a stress current and another voltage on another SRAM circuit path defined by the second p-type transistor/second resistor, the second n-type transistor, and the another pass-gate transistor is pulled down by the stress current to test whether a defect in the SRAM cell exists to change the digital value of the SRAM cell to the opposite value.

Still another aspect and advantage of the present invention is that the stress control voltage applied to activate the stress test component is varied to change stress amounts applied to the memory device.

A still further aspect and advantage of the present invention is to also provide the stress test circuit with a balanced excessive resistance detector coupled to the bit line and the complementary bit line for detecting and indicating the memory cell as being defective when a generally equal amount of excessive resistance exist along the bit line and the complementary bit line.

Another object and advantage of the present invention is to provide a method of testing a memory cell (e.g., SRAM cell) of a memory device (e.g., SRAM device) which includes the steps of writing a digital value in the memory cell of the memory device in which the memory cell is driven by a bit line and a complementary bit line accessed through a word line and has an SRAM circuit path for maintaining and storing the digital value and another SRAM circuit path for maintaining and storing a complementary digital value; stressing the memory cell by electrically coupling a resistance element between the bit line and the complementary bit line; and reading the digital value in the memory cell accessed through the word line to determine whether the digital value has changed to an opposite value.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 2A:
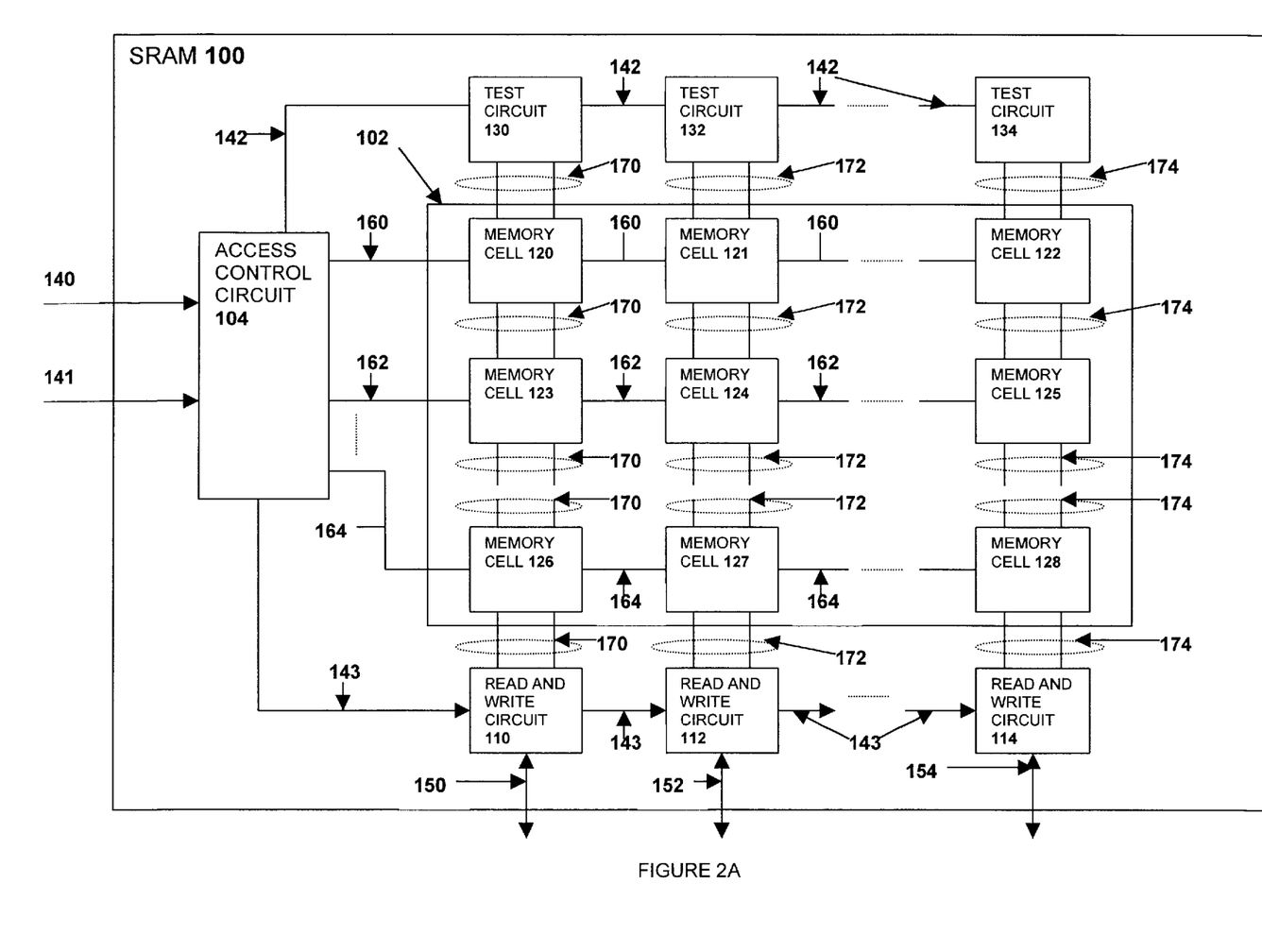
FIG. 2A is an exemplary circuit block diagram for an embodiment of a static random access memory ("SRAM") device according to the present invention.

A stress test circuit and method for static random access memory ("SRAM") cells of an SRAM device are described. In FIG. 2A, a circuit block diagram for an embodiment of a static random access memory ("SRAM") device 100 according to the present invention is shown. SRAM device 100 includes a memory array 102 of memory cells 120 to 128, an access control circuit 104, and a plurality of read and write circuits 110, 112, . . . 114. SRAM device 100 further includes a number of stress test circuits 130, 132, . . . 134. A stress test circuit is coupled to and associated with each column of memory cells.

Access control circuit 104 controls and drives a single word line 160, 162, . . . , or 164 of memory cell array 102. Access control circuit 104 drives exactly one of word lines 160, 162, . . . 164 to perform read and write operations to memory cells 120 to 128. Each individual word line 160, 162, . . . 164 corresponds to a row of memory cell array 102.

For example, individual word line 160 corresponds to a row of memory cell array 102 that includes memory cells 120, 121, . . . 122. Furthermore, individual word line 162 correlates to a row of memory cell array 102 having memory cells 123, 124, . . . 125, and individual word line 164 correlates to a row that has memory cells 126, 127, . . . 128.

Read and write circuits 110, 112, . . . 114 are respectively coupled to bit line pairs 170, 172, . . . 174 of memory cell array 102. Read and write circuits 110, 112, . . . 114 have read or sense amplifiers and operational write circuits. Read or sense amplifiers detect data on bit line pairs 170, 172, . . . 174 during read operations, and operational write circuits drive data onto bit line pairs 170, 172, . . . 174 during write operations to memory cell array 102. Read and write circuits 110, 112, . . . 114 also perform pre-charge operations that pretty charge bit line pairs 170, 172, . . . 174 to a predetermined voltage level. Any suitable read and write circuit for reading and writing to memory cells may be used in conjunction with the present invention.

Each bit line pair 170, 172, . . . 174 carries data for a corresponding column of memory cell array 102. For example, bit line pair 170 is coupled to and through a column of memory cell array 102 including memory cells 120, 123, . . . 126. Additionally, bit line pair 172 is coupled to and through a column comprising memory cells 121, 124 . . . 127, and bit line pair 174 is coupled to and through a column comprising memory cells 122, 125, . . . 128.

Access control circuit 104 activates and enables stress tests on memory cell array 102 using a stress control signal sent through a stress control line 142. A stress test involves a series of write, stress, and read operations to verify cycles performed row by row on memory cell array 102. A series of operations involving writing a one ("1") as the digital value into the memory cell, stressing the memory cell with the respective stress test circuit, and reading the memory cell to verify the one ("1") is still stored therein verifies the capability of memory cells 120 to 128 in retaining a one ("1") value. Another series of operations involving writing a zero ("0") as the digital value into the memory cell, stressing the memory cell with the respective stress test circuit, and reading the memory cell to verify whether the zero ("0") is still stored therein verifies the capability of the memory cells 120 to 128 in retaining a zero ("0") value.

Stress control signal sent through stress control line 142 is not activated or sent during normal read and write operations of memory cell array 102, and stress test circuits 130, 132, . . . 134 during these operations are maintained as inactive. Stress test circuits 130, 132, . . . 134 add relatively small capacitive loads and have minimal impact on the normal operation of memory cell array 102. Capacitance of bit line pairs 170, 172, . . . 174 are relatively large compared to stress test circuits 130, 132, . . . 134 since a large number of memory cells 120 to 128 are often coupled to each bit line pair 170, 172, . . . 174.

A typical write operation for SRAM device 100 involves access control circuit 104 receiving an address over an address bus 140 and an access control signal containing read/write information, enable data, clock signals, etc., over a control bus 141. Access control circuit 104 drives read and write circuits 110, 112, . . . 114 during read and write operations by sending a read/write control signal through a control line 143. Read and write circuits 110, 112, . . . 114 receive data over a plurality of respective data lines 150, 152, . . . 154. Each read and write circuit 110, 112, . . . 114 receives a data bit over corresponding data line 150, 152, . . . 154. For example, read and write circuit 110 receives a data bit over data line 150. Read and write circuit 112 receives a data bit over data line 152, and read and write circuit 114 receives a data bit over data line 154. Access control circuit 104 drives a write control signal through control line 143 so that operational write circuits within read and write circuits 110, 112, . . . 114 drive received data onto bit line pairs 170, 172, . . . 174. Access control circuit 104 drives one of word lines 160, 162, . . . 164 according to the address received over address bus 140 during the write operation. Activated word line 160, 162, . . . or 164 determines the row of memory cells in memory cell array 102 that is written with data using typical or suitable ways of decoding data.

In a normal read operation of SRAM device 100, access control circuit 104 receives an address over address bus 140. Access control circuit 104 decodes the read address and drives appropriate word line 160, 162, . . . or 164. Activated word line 160, 162, . . . or 164 causes corresponding row of memory cells in memory cell array 102 to drive data onto bit line pairs 170, 172, . . . 174. Access control circuit 104 drives a read control signal through control line 143 so that read or sense amplifiers which are part of read and write circuits 110, 112, . . . 114 each detects the data signal on corresponding bit line pairs 170, 172, . . . 174 and amplify the data signal. Read and write circuits 110, 112, . . . 114 then drive read data from memory cells of memory cell array 102 over respective data lines 150, 152, . . . 154.

Figure 2B:
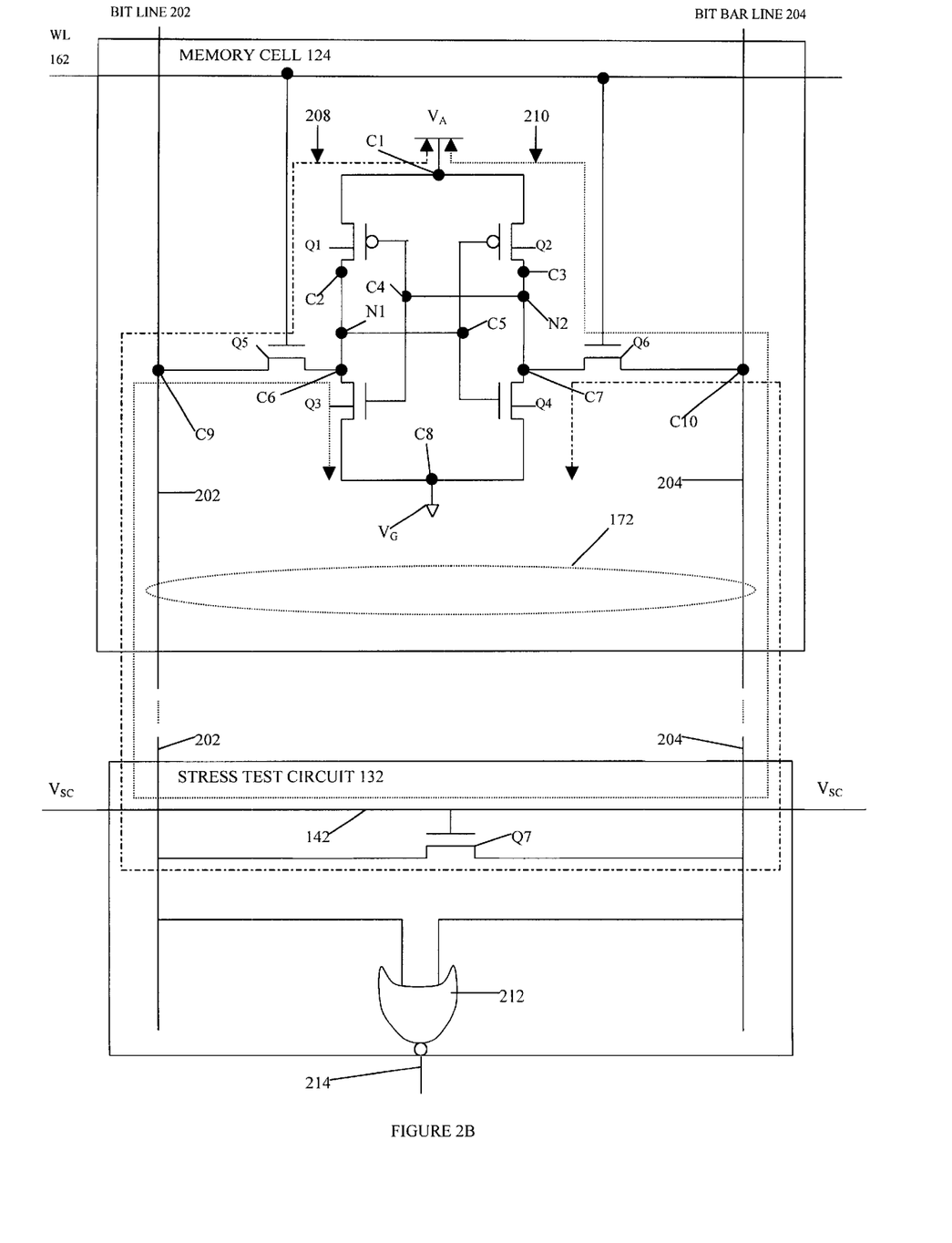
FIG. 2B is an exemplary circuit diagram for an embodiment of a memory cell and stress test circuit according to the present invention.

FIG. 2B shows a circuit diagram of an embodiment for memory cell 124 and stress test circuit 132. Memory cells 120 to 123 and 125 to 128 may be identical in configuration and design to exemplary memory cell 124. Memory cell 124 is a typical SRAM cell that includes a plurality of transistors Q1 to Q6 configured in a manner to form cross-coupled inverters as shown in FIG. 2B. The sources of transistors Q1 and Q2 are coupled to a pull-up voltage source VA. The drains of transistors Q1 and Q2 are respectively coupled in series to the sources of transistors Q3 and Q4. The drains of transistors Q3 and Q4, in turn, are coupled to a pull-down voltage or ground $V_G$. Transistors Q1 and Q3 form a first inverter while transistors Q2 and Q4 form a second inverter. Transistors Q1 and Q2 are first and second p-type transistors while transistors Q3 and Q4 are first and second n-type transistors. Fabrication defects in the transistor(s) or along the transistor path(s) may reduce the strength of the pull-up p-type transistors Q1 and Q2 and/or the pull-down n-type transistors Q3 and Q4, and these defects are a potential source of data retention defects. Other types of fabrication defects are from leakage paths at node N1 and/or node N2, which may also be potential sources of data retention defects.

Bit line pair 172 consists of a bit line 202 and a complementary bit line, bit bar line 204, as shown in FIG. 2B. Transistor Q5 is a pass gate transistor, which couples a node N1 to bit line 202. The source of transistor Q5 is coupled to node N1, which is the node where the drain of transistor Q1 and the source of transistor Q3 meet. The drain of transistor Q5 is coupled to bit line 202, and the gate of transistor Q5 is coupled to word line ("WL") 162. Similarly, the transistor Q6 is another pass gate transistor that connects a node N2, which is the node where the drain of transistor Q2 and the source of transistor Q4 are coupled thereat, to bit bar line 204. The drain of transistor Q6 is coupled to bit bar line 204, and the gate of transistor Q6 is coupled to word line ("WL") 162. Also, the source of transistor Q6 is coupled to node N2. Transistors Q5 and Q6 and, in turn, memory cell 124 are activated by word line 162.

Various contacts, such as contacts c1 to c10, exist in circuit paths of memory cell 124. Exemplary contacts c1 to c10 are located at diffusion regions, poly-silicon structures, metal interconnect structures, and/or vias of the integrated circuit containing SRAM device 100 of FIG. 2A. Defects may exist or be generated from contacts, such as contacts c1 to c10, in memory cell 124. Defective contacts may result in the necessary or proper connection not being provided between the integrated circuit structures or may provide a highly resistive connection compared to other contacts. The lack of proper connections and/or the existence of highly resistive connections may cause long-term data retention problems for memory cell 124.

Exemplary stress test circuit 132 generally includes a single stress test component or transistor Q7. Transistor Q7 in FIG. 2B is an n-type transistor, and transistor Q7 couples together bit line 202 and bit bar line 204. The drain of transistor Q7 is coupled to bit line 202, and the source of transistor Q7 is coupled to bit bar line 204. The gate of transistor Q7 is coupled to stress control line 142 of FIG. 2A. A stress control voltage signal $V_{SC}$ is sent to the gate of transistor Q7 through stress control line 142 to activate transistor Q7, which, in effect, activates stress test circuit 132 to perform the stress test by stressing memory cell 124. Stress control voltage signal $V_{SC}$ may be varied to change the strength of the stress applied to memory cell 124. Varying stress control voltage signal $V_{SC}$ provides a further way to test the read or sense amplifier (e.g., to place extra demand on the read or sense amplifier) in the read circuit of read and write circuit 110, 112, ... or 114. The operation of stress test component or transistor Q7 will be discussed later in more detail.

Furthermore, if defects exist in or along the circuit paths of both p-type transistors Q1 and Q2 such that equally balanced amounts of excessive resistance exist in the two circuit paths, then the voltage values of both bit line 202 and bit bar line 204 drop to the low voltage $V_G$. In this case, memory cell 124 would not be detected as defective since the digital value stored within memory cell 124 does not change. Thus, in adjunct with stress test component or transistor Q7, stress test circuit 132 also has a balanced excessive resistance detector 212. Balanced excessive resistance detector 212 is coupled to both bit line 202 and bit bar line 204. Exemplary balanced excessive resistance detector 212 is a NOR gate as shown in FIG. 2B. The NOR gate has inputs from bit line 202 and bit bar line 204 and generates an output 214. The operation of balanced excessive resistance detector 212 will be discussed later in more detail.

If either or both the voltage values of the inputs into the NOR gate is/are of a high voltage value $V_A$, then balanced excessive detector 212 generates a low voltage output indicating that balanced excessive resistance has not been detected in or along the circuit paths of both p-type transistors Q1 and Q2 and an indication that memory cell 124 being defective for this reason is not necessary. However, if both the voltage values of the inputs into the NOR gate are of low voltage values $V_G$, then balanced excessive resistance detector 212 generates a high voltage output. This high voltage output indicates that a balanced excessive resistance in or along the circuit paths of both p-type transistors Q1 and Q2 exists. In this case, an indication that memory cell 124 is defective is then necessary and generated. Also, to detect balanced excessive resistance in or along the circuit paths of both n-type transistors Q3 and Q4, a NAND gate may be used in the similar fashion as the NOR gate in which a low output of the NAND gate indicates a defective memory cell.

Figure 2C:
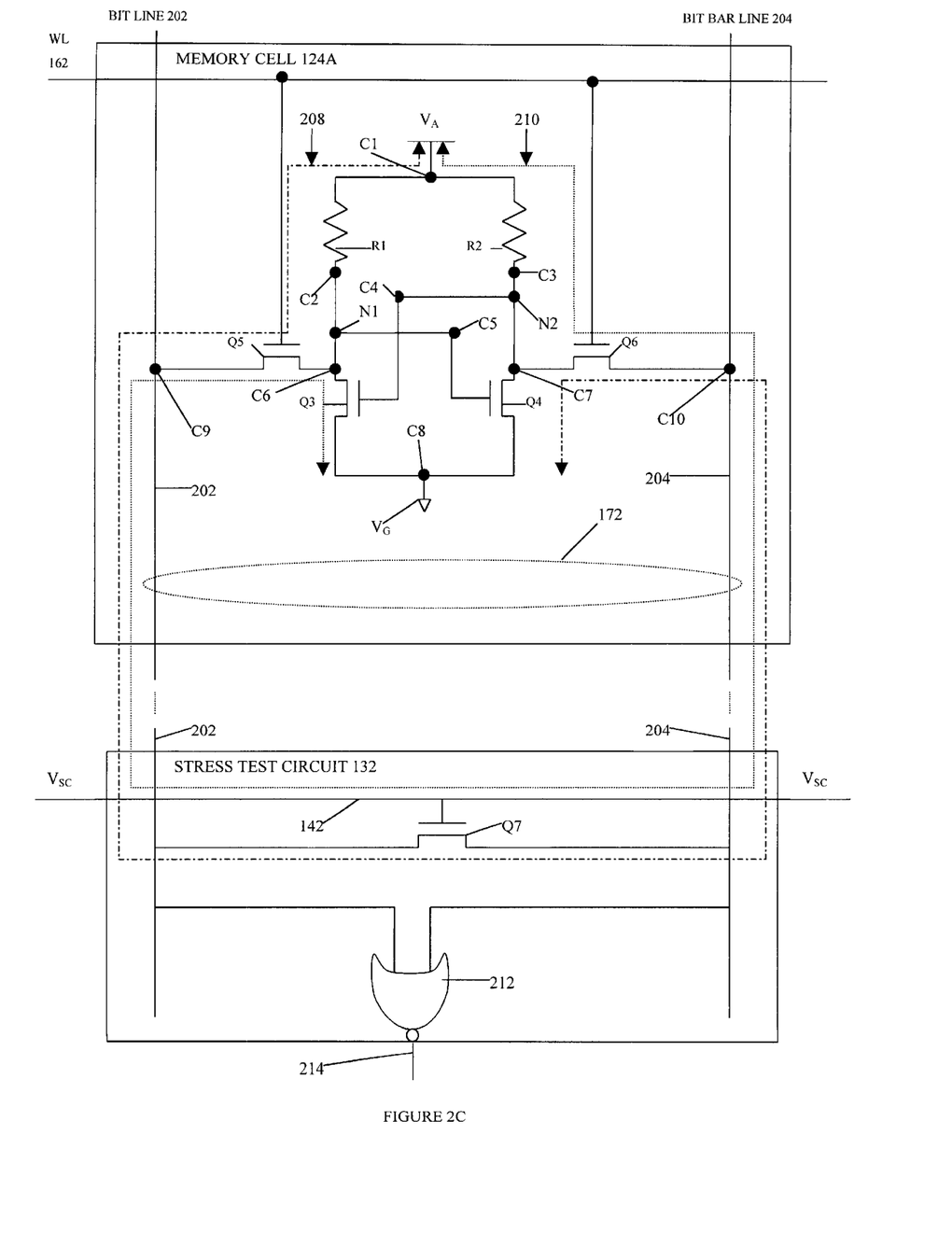
FIG. 2C is an exemplary circuit diagram for another embodiment of a memory cell and stress test circuit according to the present invention.
Figure 2D:
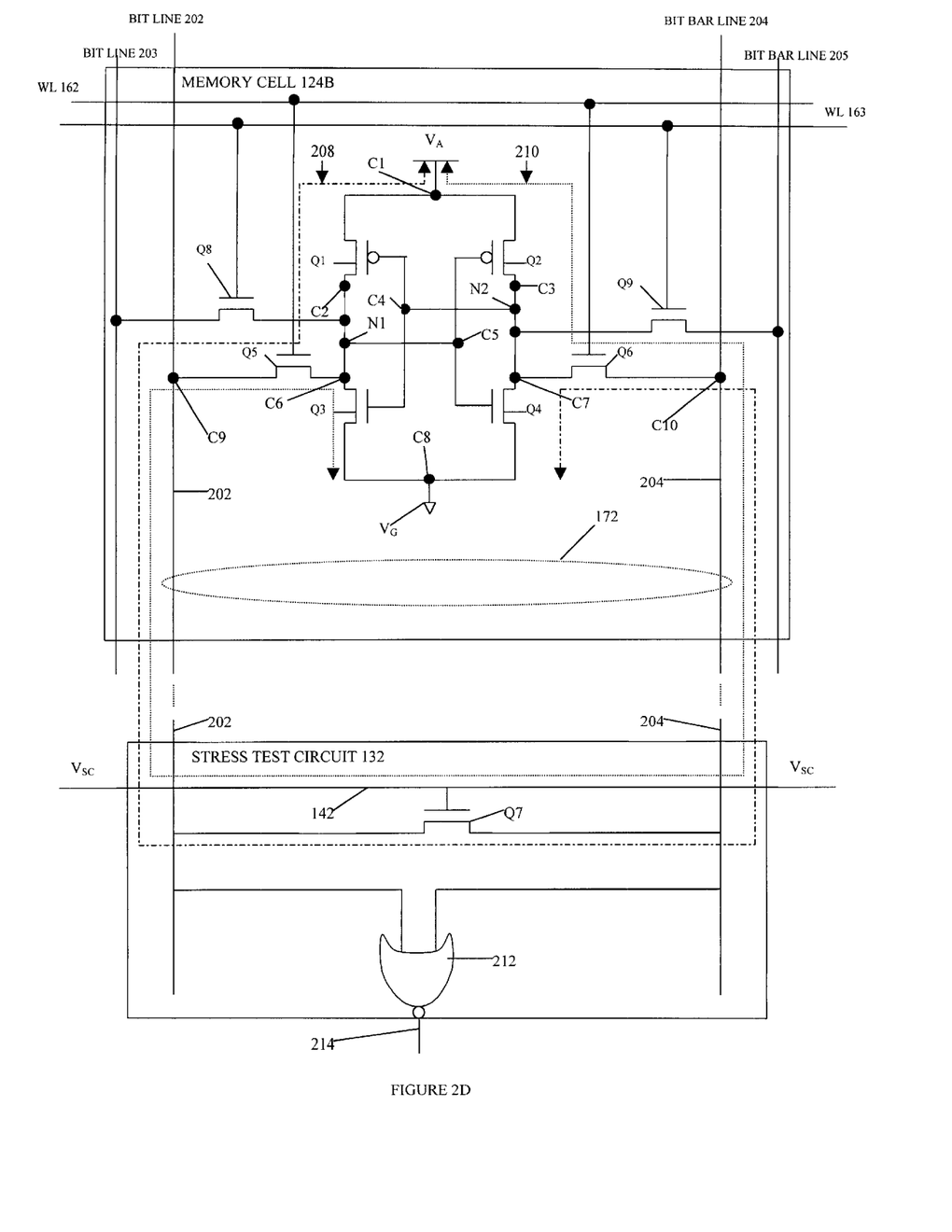
FIG. 2D is an exemplary circuit diagram for a still further embodiment of a memory cell and stress test circuit according to the present invention.

Also, stress test circuit 132 according to the present invention is not in any way limited to being used with any particular memory cell embodiment. FIGS. 2C and 2D show alternative embodiments for the memory cell with which stress test circuit 132 is used. FIG. 2C shows another embodiment of a memory cell 124A which is identical to memory cell 124 of FIG. 2B except that resistors R1 and R2 are utilized in memory cell 124A instead of p-type transistors Q1 and Q2 in memory cell 124. Stress test circuit 132 is used in the same manner with memory cell 124A as with memory cell 124. Furthermore, FIG. 2D shows still another embodiment of a memory cell 124B which is also identical to memory cell 124 except that memory cell 124B is a multi-port cell having an additional pair of bit lines that include bit line 203 and bit bar line 205, two other pass-gate transistors Q8 and Q9 for respectively coupling bit line 203 and bit bar line 205 to memory cell 124B, and another word line 163 for activating bit line 203 and bit bar line 205. Again, stress test circuit 132 is used in the same manner with memory cell 124B as with memory cell 124.

Figure 3:
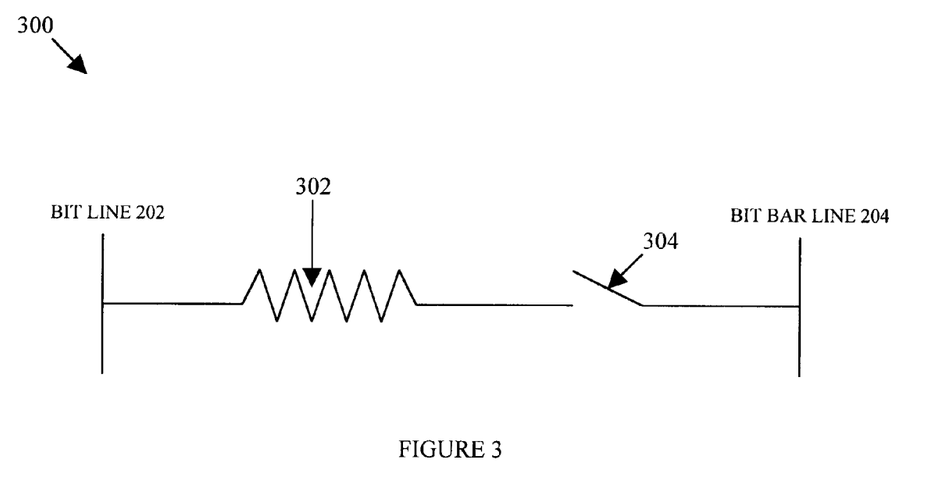
FIG. 3 is a representative circuit diagram depicting the main operations of the stress test circuit according to the present invention.

FIG. 3 shows a representative circuit diagram 300 depicting the primary operation of stress test circuit 132 of FIGS. 2A to 2D. The main operation of stress test circuit 132 is to control through a switch 304 the electrical coupling of a resistance element 302 between bit line 202 and bit bar line 204. The electrical coupling of resistance element 302 applies voltage stresses on transistors and contacts of the memory cells. After the voltage stresses are applied, then switch 304 de-activates the coupling of resistance element 302 between bit line 202 and bit bar line 204. A determination is then made as to whether the digital values of the memory cells have changed states due to the applied voltage stresses. Transistor Q7 provides such a resistance element 302 and switch 304 to couple between bit line 202 and bit bar line 204.

Figure 4A:
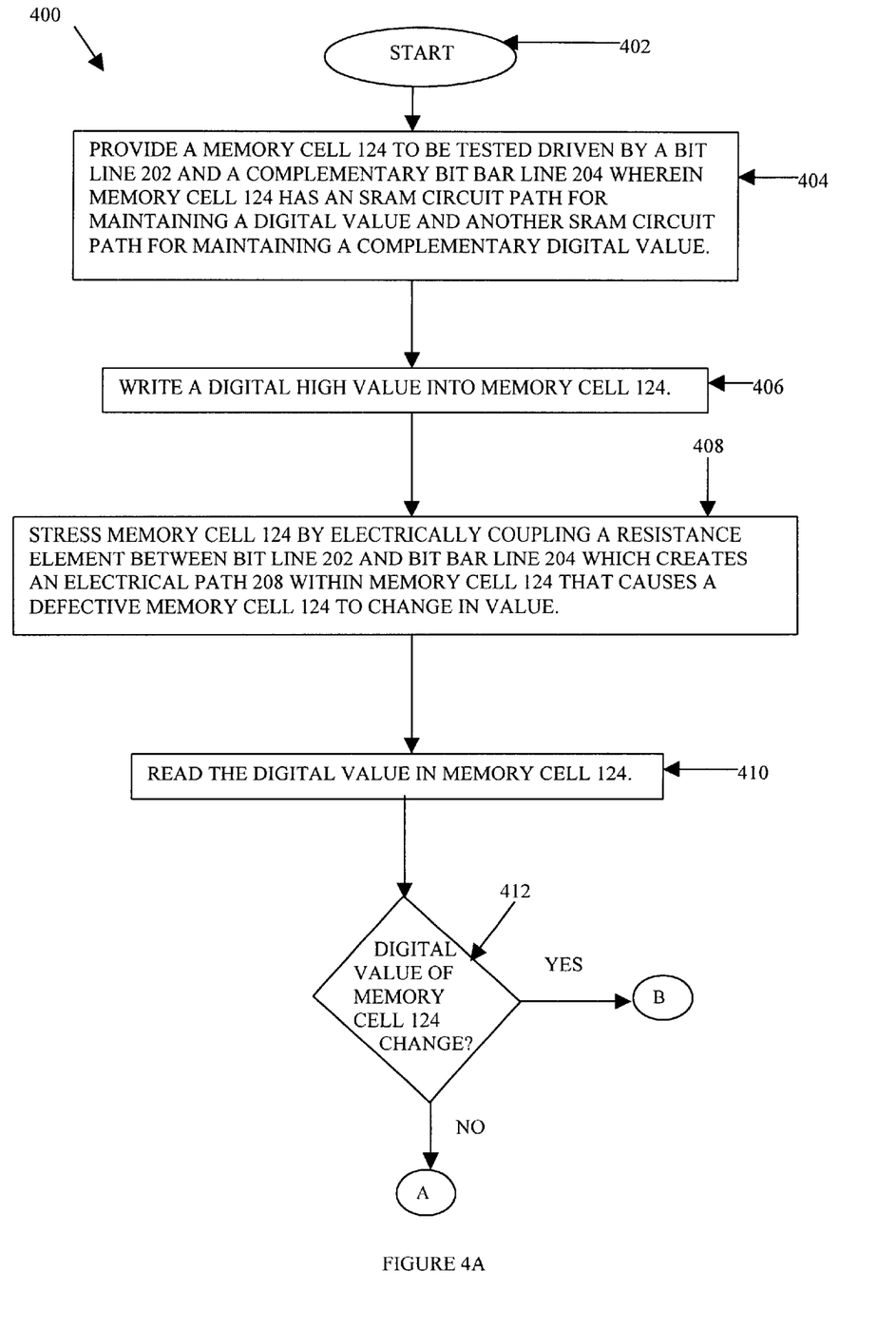
FIGS. 4A and 4B are an exemplary flow chart diagram illustrating an implementation for using the stress test circuit according to the present invention.
Figure 4B:
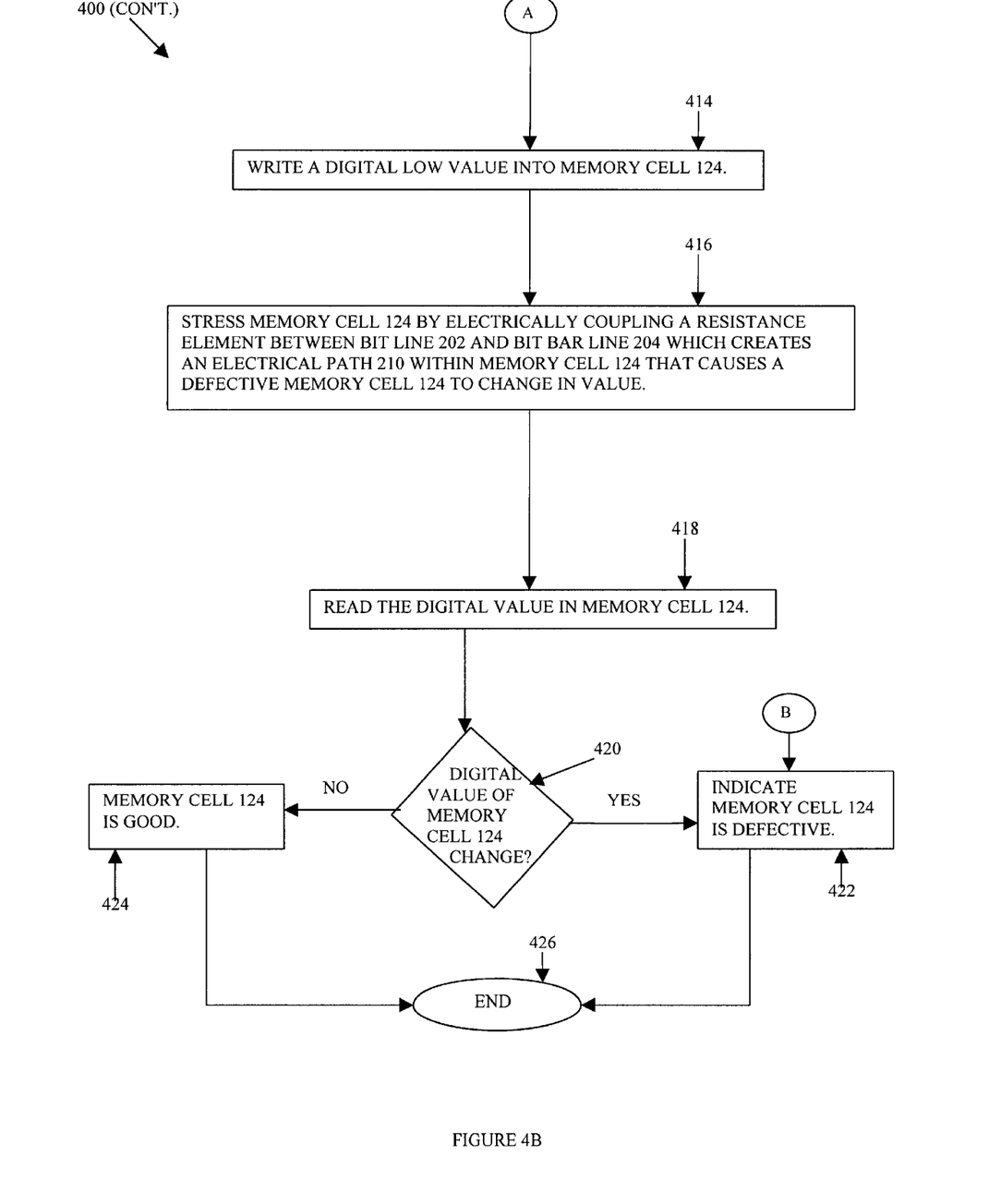

FIGS. 4A and 4B show an exemplary flow chart diagram 400, which illustrates a method and implementation for using stress test circuit 132 in FIG. 2B according to the present invention. Flow chart diagram 400 starts at block 402. Following block 402, block 404 depicts the providing of a memory cell that is to be tested, such as memory cell 124, driven by a bit line (e.g., bit line 202) and a complementary bit line (e.g., bit bar line 204). Memory cell 124 has an SRAM circuit path which includes at least transistors Q1, Q3, and Q5 and is connected to bit line 202 to maintain the digital value of memory cell 124 (see FIG. 2B). Memory cell 124 also has another SRAM circuit path which includes at least transistors Q2, Q4, and Q6 and is connected to bit bar line 204 in order to maintain the complementary digital value of memory cell 124 (see FIG. 2B). During a read operation, both bit line 202 and bit bar line 204 are pre-charged to the high voltage value (e.g., high digital value). The method shown in flow chart diagram 400 then moves to block 406, which illustrates the writing of a high digital value into memory cell 124. The writing of the high digital value is generally accomplished by maintaining bit line 202 at the high digital value and pulling down bit bar line 204 from the pre-charged high digital value to the low digital value.

The method in flow chart diagram 400 then moves from block 406 to block 408, which represents stressing of memory cell 124 by electrically coupling a stress test circuit, such as stress test circuit 132 having at least a resistance element and a switch, between bit line 202 and complementary bit line 204. Stress test circuit 132 is enabled and activated by sending stress control signal through stress control line 142 (see FIG. 2A). When stress test circuit 132 is activated, an electrical path 208 as shown in FIG. 2B is automatically created within memory cell 124. Electrical path 208 drives currents in a manner within memory cell 124 causing a defective memory cell 124 to change in value. Electrical path 208 causes the voltage of the SRAM circuit path to be pulled down by a stress current flowing through stress test circuit 132 and causes another voltage of the other SRAM circuit path to be pulled up by the stress current.

Referring back to FIG. 2B, electrical path 208 is a circuit path that follows along pull-up voltage source $V_A$, first p-type transistor Q1, first pass-gate transistor Q5, stress test component or transistor Q7, second pass-gate transistor Q6, and second n-type transistor Q4. First p-type transistor Q1 and second n-type transistor Q4 are on or activated while second p-type transistor Q2 and first n-type transistor Q3 are off or de-activated. When stress test circuit 132 is activated, the stress current causes the voltages on nodes N1 and N2 to change in which new voltages are applied respectively to second p-type transistor Q2 and first n-type transistor Q3. Transistors Q2 and Q3 then turn slightly on.

If excessive resistance from defects or contact flaws (e.g., any flaws at or about contact c1 to c10) does not exist in the two SRAM circuit path and excessive leakage paths within memory cell 124 also do not exist, then transistors Q2 and Q3 turning slightly on will not have a digital value changing effect on memory cell 124. Slightly activated transistors Q2 and Q3 will generally not overwhelm or overpower activated transistors Q1 and Q4. Transistors Q2 and Q3 stay generally off or almost off while transistors Q1 and Q4 stay generally on. In this situation, the high digital value of memory cell 124 does not change or switch to the complementary low digital value indicating memory cell 124 is not defective. On the other hand, if excessive resistance from defects or contact flaws (e.g., any flaws at or around contact c1 to c10) does exist in the two SRAM circuit path, then transistors Q2 and Q3 turning slightly on and the existence of excessive resistance in either or both of the two SRAM circuit paths cause transistors Q2 and Q3 to continue to turn on "more" to the point that transistors Q2 and Q3 eventually overwhelm or overpower activated transistors Q1 and Q4. The overwhelming or overpowering of transistors Q2 and Q3 and the existence of excessive resistance result in transistors Q1 and Q4 eventually turning off. In this case, the high digital value of memory cell 124 does change or switch to the complementary low digital value indicating memory cell 124 is defective.

Referring back to FIG. 4A, the method shown in flow chart diagram 400 then proceeds from block 408 to block 410, which illustrates the digital value in memory cell 124 being read. The reading of memory cell 124 is accomplished by typical or normal steps for performing a reading operation. The method then moves from block 410 to decision block 412. If the digital value of memory cell 124 has changed from the high value to the low value at decision block 412, then the method moves from decision block 412 of FIG. 4A directly to block 422 of FIG. 4B via connector B. Block 422 shows that memory cell 124 is indicated as being defective. Following block 422, the method ends at block 426. If, however, the digital value of memory cell 124 has not changed at decision block 412, then the method proceeds from decision block 412 to block 414 of FIG. 4B via connector A.

During the read operation, both bit line 202 and bit bar line 204 are pre-charged to the high voltage value (e.g., high digital value). Block 414 illustrates the writing of a low digital value into memory cell 124. The writing of the low digital value is generally accomplished by pulling down bit line 202 from the pre-charged value to the low digital value and maintaining bit bar line 204 at the high digital value. The method in flow chart diagram 400 then moves from block 414 to block 416, which represents stressing of memory cell 124 by electrically coupling stress test circuit 132 having at least a resistance element and a switch between bit line 202 and complementary bit line 204. Stress test circuit 132 is enabled and activated by sending stress control signal through stress control line 142 (see FIG. 2A). When stress test circuit 132 is activated, an electrical path 210 as shown in FIG. 2B is automatically created within memory cell 124. Electrical path 210 drives currents in a manner within memory cell 124 causing a defective memory cell 124 to change in value. Electrical path 210 causes the voltage of the SRAM circuit path to be pulled up by a stress current flowing through stress test circuit 132 and causes another voltage of the other SRAM circuit path to be pulled down by the stress current.

Referring back to FIG. 2B, electrical path 210 is a circuit path that follows along pull-up voltage source $V_A$, second p-type transistor Q2, second pass-gate transistor Q6, stress test component or transistor Q7, first pass-gate transistor Q5, and first n-type transistor Q3. First p-type transistor Q1 and second n-type transistor Q4 are off while second p-type transistor Q2 and first n-type transistor Q3 are on. When stress test circuit 132 is activated, the stress current causes the voltages on nodes N1 and N2 to change in which new voltages are applied respectively to second n-type transistor Q4 and first p-type transistor Q1. Transistors Q1 and Q4 then turn slightly on.

If excessive resistance from defects or contact flaws (e.g., any flaws at or about contact c1 to c10) does not exist in the two SRAM circuit path and excessive leakage paths within memory cell 124 also do not exist, then transistors Q1 and Q4 turning slightly on will not have a digital value changing effect on memory cell 124. Slightly activated transistors Q1 and Q4 will generally not overwhelm or overpower activated transistors Q2 and Q3. Transistors Q1 and Q4 stay generally off or almost off while transistors Q2 and Q3 stay generally on. In this situation, the low digital value of memory cell 124 does not change or switch to the complementary high digital value indicating memory cell 124 is not defective. On the other hand, if excessive resistance from defects or contact flaws (e.g., any flaws at or around contact c1 to c10) does exist in the two SRAM circuit path, then transistors Q1 and Q4 turning slightly on and the existence of excessive resistance in either or both of the two SRAM circuit paths cause transistors Q1 and Q4 to continue to turn on "more" to the point that transistors Q1 and Q4 eventually overwhelm or overpower activated transistors Q2 and Q3. The overwhelming or overpowering of transistors Q1 and Q4 and the existence of excessive resistance result in transistors Q2 and Q3 eventually turning off. In this case, the low digital value of memory cell 124 does change or switch to the complementary high digital value indicating memory cell 124 is defective.

Referring back to FIG. 4B, the method shown in flow chart diagram 400 proceeds from block 416 to block 418, which illustrates the digital value in memory cell 124 again being read. The reading of memory cell 124 is performed by typical or normal steps for executing a reading operation for a memory cell. The method then moves onto decision block 420. If the digital value of memory cell 124 has changed from the low value to the high value at decision block 420, then the method moves from decision block 420 to block 422. Block 422 shows that memory cell 124 is indicated as being defective. Following block 422, the method ends at block 426. If, however, the digital value of memory cell 124 has not changed at decision block 420, then the method proceeds from decision block 420 to block 424, which depicts memory cell 124 is considered to be a good cell. The method ends at block 426. The automatic creation of the appropriate electrical path 208 or 210 provides a self stressing test that does not require prior knowledge of the states of the digital value (e.g., whether a stress test "1" or a stress test "0" needs to be performed) in order to perform the stress test.

Figure 5:
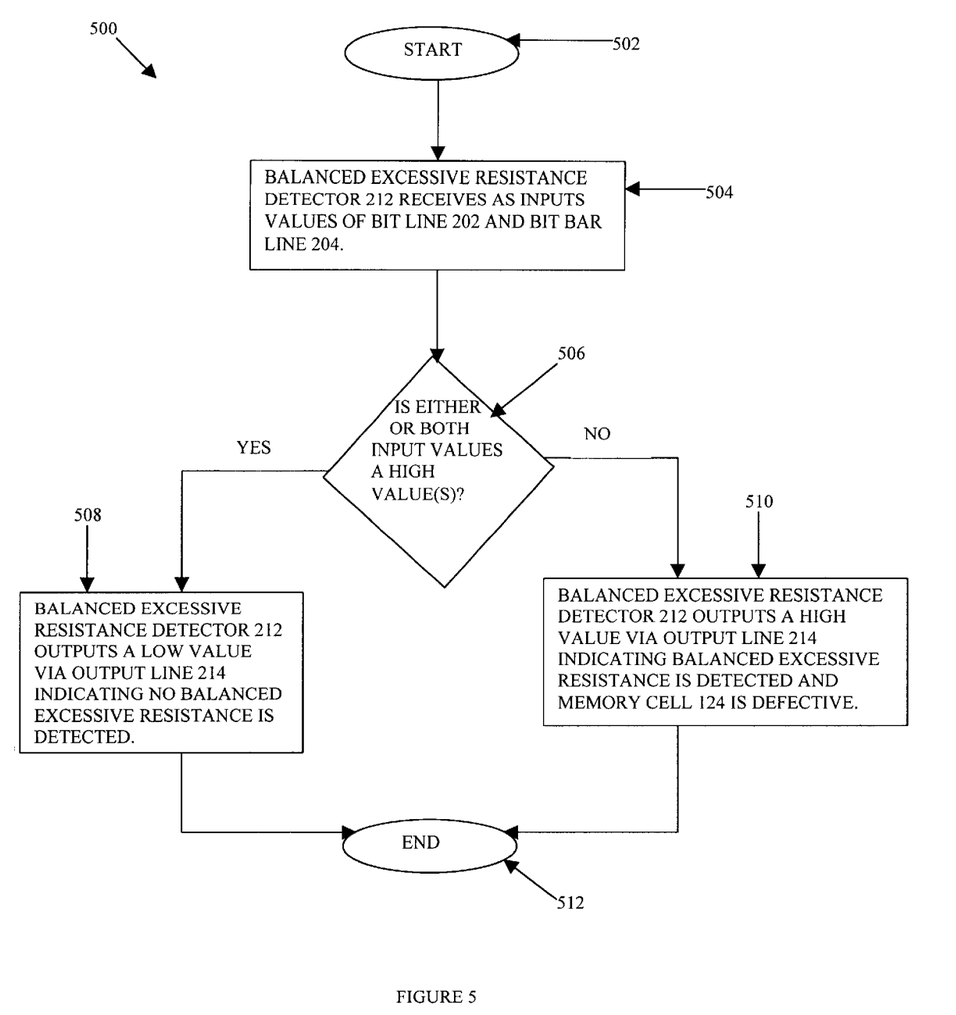
FIG. 5 is an exemplary flow chart diagram illustrating an implementation for using a balanced excessive resistance detector according to the present invention.

As stated earlier, defects may exist in or along the circuit paths of both p-type transistors Q1 and Q2 such that equally balanced amounts of excessive resistance exist in the two circuit paths. In this situation, the voltage values of both bit line 202 and bit bar line 204 drop to the low voltage $V_G$. In this case, memory cell 124 would not be detected as defective by the method in flow chart diagram 400 of FIGS. 4A and 4B since the digital value of memory cell 124 does not change. FIG. 5 shows an exemplary flow chart diagram 500, which illustrates a method of implementing and using balanced excessive resistance detector 212 of FIG. 2B. This method in flow chart diagram 500 is used in adjunct with the method in flow chart diagram 400 of FIGS. 4A and 4B. As mentioned earlier, balanced excessive resistance detector 212 is coupled to both bit line 202 and bit bar line 204 and is a NOR gate. The NOR gate has inputs from bit line 202 and bit bar line 204 and generates an output 214.

The method shown in flow chart diagram 500 starts at block 502. Following block 502, the method moves to block 504, which shows balanced excessive resistance detector 212 (e.g., the NOR gate) receiving as inputs values of bit line 202 and bit bar line 204 (e.g., see FIG. 2B). The method proceeds from block 504 to decision block 506, which depicts a determination whether either or both the input values of balanced excessive resistance detector 212 is a high value(s). If either or both input values is/are a high value(s) at decision block 506, then the method moves from decision block 506 to block 508. Block 508 illustrates balanced excessive resistance detector 212 outputting a low value via output line 214, which reflects that no balanced excessive resistance is detected (e.g., either or both bit line 202 and bit bar line 204 is/are high). The method then ends at block 512. However, if both input values are low values at decision block 506, then the method moves from decision block 506 to block 510. Block 510 shows balanced excessive resistance detector 212 outputting a high value via output line 214 indicating balanced excessive resistance is detected (e.g., both bit line 202 and bit bar line 204 are low). Furthermore, memory cell 124 is indicated as being defective. The method ends at block 512.

The present invention discloses a stress test circuit and method for a memory cell of a memory device. The present invention provides a memory test circuit, which does not require driving currents having to be carefully matched to the memory cell or device in order to avoid overdriving and/or underdriving a memory cell. The stress test circuit according to the present invention is simple in design and requires only a small number of components. The stress test circuit according to the present invention uses less components and minimizes the overall space and cost of the memory device. The stress test circuit according to the present invention also automatically identifies or self determines which test (e.g., stress test zero or stress test one) is to be executed without any prior knowledge or programming and accordingly performs that test. Automatic identification or self determination of the appropriate test eliminates or minimizes the logic, methodology, or programmed/manual control for having to determine which test is to be executed.

The present invention is not in any way limited to being implemented within any memory circuit, memory device, or memory configuration or by using any particular stress test component, device, or subsystem configured in a particular way. The present invention may be implemented within any suitable system or configuration and/or by using any suitable component, device, system, or configuration. For example, the present invention is not limited in any way to being used in a particular SRAM configuration. The SRAM device may also be configured to have multiple columns of memory cells fed into a single read and write circuit that may incorporate the test circuit according to the present invention. Furthermore, the drains and sources of the stress test transistor and the pass-gate transistors will reverse during certain operational states.

While the invention has been particularly shown and described with reference to a preferred embodiment, it will be understood by those skilled in the art that various changes in form and detail may be made therein without departing from the spirit and scope of the invention.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. A stress test circuit for static random access memory ("SRAM") cells of an SRAM device, comprising:
    a stress test component having a resistance element and a switch component to electrically couple the resistance element between a bit line and a complementary bit line both driven by a word line of an SRAM cell storing a digital value written therein;
    wherein the stress test component is activated to electrically couple the resistance element to the bit line and the complementary bit line and create an electrical path causing a defective memory cell to change in value.

2. The stress test circuit according to claim 1, wherein the stress test component is a transistor having a source coupled to the bit line, a drain coupled to the complementary bit line, and a gate that receives a stress control voltage for controlling activation of the stress test component.

3. The stress test circuit according to claim 1, wherein the SRAM cell comprises:
    two cross-coupled inverters wherein a first one of the two cross-coupled inverters has a first p-type transistor and a first n-type transistor and a second one of the two cross-coupled inverters has a second p-type transistor and a second n-type transistor;
    a pass-gate transistor that couples a node between the first p-type transistor and the first n-type transistor to the bit line; and
    another pass-gate transistor that couples another node between the second p-type transistor and the second n-type transistor to the complementary bit line.

4. The stress test circuit according to claim 3, wherein the digital value is a high value and the complementary digital value is a low value and wherein a voltage on a SRAM circuit path defined by the first p-type transistor, the first n-type transistor, and the pass-gate transistor is pulled down by a stress current and another voltage on another SRAM circuit path defined by the second p-type transistor, the second n-type transistor, and the another pass-gate transistor is pulled up by the stress current to test whether a defect in the SRAM cell exists to change the digital value of the SRAM cell to the opposite value.

5. The stress test circuit according to claim 4, wherein the electrical path is created and followed along a pull-up voltage source, the first p-type transistor, the pass-gate transistor, the stress test component, the another pass-gate transistor, the second n-type transistor, and a ground voltage source when the stress test component is activated and the digital value is the high value.

6. The stress test circuit according to claim 5, wherein the first p-type transistor and the second n-type transistor are on and the second p-type transistor and the first n-type transistor are off and the stress current results in voltages that are applied to the second p-type transistor and the first n-type transistor.

7. The stress test circuit according to claim 6, wherein if the second p-type transistor and the first n-type transistor turn on and overpower the first p-type transistor and the second n-type transistor and the electrical path causes the first p-type transistor and the second n-type transistor to turn off, then the digital value of the SRAM cell is changed and the SRAM cell is deemed defective.

8. The stress test circuit according to claim 3, wherein the digital value is a low value and the complementary digital value is a high value and wherein a voltage on a SRAM circuit path defined by the first p-type transistor, the first n-type transistor, and the pass-gate transistor is pulled up by a stress current and another voltage on another SRAM circuit path defined by the second p-type transistor, the second n-type transistor, and the another pass-gate transistor is pulled down by the stress current to test whether a defect in the SRAM cell exists to change the digital value of the SRAM cell to the opposite value.

9. The stress test circuit according to claim 8, wherein the electrical path is created and followed along a pull-up voltage source, the second p-type transistor, the another pass-gate transistor, the stress test component, the pass-gate transistor, the first n-type transistor, and a ground voltage source when the stress test component is activated and the digital value is the low value.

10. The stress test circuit according to claim 9, wherein the second p-type transistor and the first n-type transistor are on and the first p-type transistor and the second n-type transistor are off and the stress current results in voltages that are applied to the first p-type transistor and the second n-type transistor.

11. The stress test circuit according to claim 10, wherein if the first p-type transistor and the second n-type transistor turn on and overpower the second p-type transistor and the first n-type transistor and the electrical path causes the second p-type transistor and the first n-type transistor to turn off, then the digital value of the SRAM cell is changed and the SRAM cell is deemed defective.

12. The stress test circuit according to claim 1, wherein a stress control voltage applied to activate the stress test component is varied to change stress amounts applied to the SRAM device.

13. The stress test circuit according to claim 1, further comprising:
a balanced excessive resistance detector coupled to the bit line and the complementary bit line for detecting and indicating the SRAM cell as being defective when a generally equal amount of excessive resistance exist along the bit line and the complementary bit line.

14. The stress test circuit according to claim 13, wherein the balanced excessive resistance detector is a NOR gate.

15. The stress test circuit according to claim 1, wherein the SRAM cell comprises:
two cross-coupled inverters wherein a first one of the two cross-coupled inverters has a first resistor and a first n-type transistor and a second one of the two cross-coupled inverters has a second resistor and a second n-type transistor;
a pass-gate transistor that couples a node between the first resistor and the first n-type transistor to the bit line; and
another pass-gate transistor that couples another node between the second resistor and the second n-type transistor to the complementary bit line.

16. The stress test circuit according to claim 1, wherein the SRAM cell is a multi-port cell and a pass gate transistor couples another bit line to the SRAM cell and another pass-gate transistor couples another complementary bit line to the SRAM cell wherein another word line drives both the another bit line and the another complementary bit line.

17. A static random access memory ("SRAM") device, comprising:
a memory cell for storing a digital value wherein the memory cell has a memory component that maintains a voltage value representative of the digital value and further has another memory component that maintains another voltage representative of a complementary digital value;
an access control circuit coupled to the memory cell for enabling access to the memory cell;
a write circuit for writing and storing the digital value into the memory cell;
a read circuit for reading the digital value stored in the memory cell; and
a stress test circuit with a stress test component having a resistance element and a switch component to electrically couple the resistance element between a bit line and a complementary bit line both driven by a word line of the memory cell storing a digital value written therein wherein the stress test component is activated to electrically couple the resistance element to the bit line and the complementary bit line and create an electrical path causing a defective memory cell to change in value.

18. The SRAM device according to claim 17, wherein the stress test component is a transistor having a source coupled to the bit line, a drain coupled to the complementary bit line, and a gate that receives a stress control voltage for controlling activation of the stress test component.

19. The SRAM device according to claim 17, wherein the memory cell comprises:
two cross-coupled inverters wherein a first one of the two cross-coupled inverters has a first p-type transistor and a first n-type transistor and a second one of the two cross-coupled inverters has a second p-type transistor and a second n-type transistor;
a pass-gate transistor that couples a node between the first p-type transistor and the first n-type transistor to the bit line; and
another pass-gate transistor that couples another node between the second p-type transistor and the second n-type transistor to the complementary bit line.

20. The SRAM device according to claim 19, wherein the digital value is a high value and the complementary digital value is a low value and wherein a voltage on a SRAM circuit path defined by the first p-type transistor, the first n-type transistor, and the pass-gate transistor is pulled down by a stress current and another voltage on another SRAM circuit path defined by the second p-type transistor, the second n-type transistor, and the another pass-gate transistor is pulled up by the stress current to test whether a defect in the memory cell exists to change the digital value of the memory cell to the opposite value.

21. The SRAM device according to claim 20, wherein the electrical path is created and followed along a pull-up voltage source, the first p-type transistor, the pass-gate transistor, the stress test component, the another pass-gate transistor, the second n-type transistor, and a ground voltage source when the stress test component is activated and the digital value is the high value.

22. The SRAM device according to claim 21, wherein the first p-type transistor and the second n-type transistor are on and the second p-type transistor and the first n-type transistor are off and the stress current results in voltages that are applied to the second p-type transistor and the first n-type transistor.

23. The SRAM device according to claim 22, wherein if the second p-type transistor and the first n-type transistor turn on and overpower the first p-type transistor and the second n-type transistor and the electrical path causes the first p-type transistor and the second n-type transistor to turn off, then the digital value of the memory cell is changed and the memory cell is deemed defective.

24. The SRAM device according to claim 19, wherein the digital value is a low value and the complementary digital value is a high value and wherein a voltage on a SRAM circuit path defined by the first p-type transistor, the first n-type transistor, and the pass-gate transistor is pulled up by a stress current and another voltage on another SRAM circuit path defined by the second p-type transistor, the second n-type transistor, and the another pass-gate transistor is pulled down by the stress current to test whether a defect in the memory cell exists to change the digital value of the memory cell to the opposite value.

25. The SRAM device circuit according to claim 24, wherein the electrical path is created and followed along a pull-up voltage source, the second p-type transistor, the another pass-gate transistor, the stress test component, the pass-gate transistor, the first n-type transistor, and a ground voltage source when the stress test component is activated and the digital value is the low value.

26. The SRAM device according to claim 25, wherein the second p-type transistor and the first n-type transistor are on and the first p-type transistor and the second n-type transistor are off and the stress current results in voltages that are applied to the first p-type transistor and the second n-type transistor.

27. The SRAM device according to claim 26, wherein if the first p-type transistor and the second n-type transistor turn on and overpower the second p-type transistor and the first n-type transistor and the electrical path causes the second p-type transistor and the first n-type transistor to turn off, then the digital value of the memory cell is changed and the memory cell is deemed defective.

28. The SRAM device according to claim 17, wherein a stress control voltage applied to activate the stress test component is varied to change stress amounts applied to the SRAM device.

29. The SRAM device according to claim 17, further comprising:
a balanced excessive resistance detector coupled to the bit line and the complementary bit line for detecting and indicating the memory cell as being defective when a generally equal amount of excessive resistance exist along the bit line and the complementary bit line.

30. The SRAM device according to claim 29, wherein the balanced excessive resistance detector is a NOR gate.

31. The SRAM device according to claim 17, wherein the memory cell comprises:
two cross-coupled inverters wherein a first one of the two cross-coupled inverters has a first resistor and a first n-type transistor and a second one of the two cross-coupled inverters has a second resistor and a second n-type transistor;
a pass-gate transistor that couples a node between the first resistor and the first n-type transistor to the bit line; and
another pass-gate transistor that couples another node between the second resistor and the second n-type transistor to the complementary bit line.

32. The SRAM device according to claim 17, wherein the memory cell is a multi-port cell and a pass gate transistor couples another bit line to the memory cell and another pass-gate transistor couples another complementary bit line to the memory cell wherein another word line drives both the another bit line and the another complementary bit line.

33. A method of testing a memory cell of a static random access memory ("SRAM") device, comprising:
writing a digital value in a memory cell of a static random access memory ("SRAM") device wherein the memory cell is driven by a bit line and a complementary bit line accessed through a word line and has an SRAM circuit path for maintaining and storing the digital value and another SRAM circuit path for maintaining and storing a complementary digital value;
stressing the memory cell by electrically coupling a resistance element between the bit line and the complementary bit line; and
reading the digital value in the memory cell accessed through the word line to determine whether the digital value has changed to an opposite value.

34. The method according to claim 33, wherein the digital value is a high value and the complementary digital value is a low value and wherein the stressing step further comprises:
pulling down, by a stress current, a voltage on the SRAM circuit path; and
pulling up, by the stress current, another voltage on the another SRAM circuit path.

35. The method according to claim 33, wherein the digital value is a low value and the complementary digital value is a high value and wherein the stressing step further comprises:
pulling up, by a stress current, a voltage on the SRAM circuit path; and
pulling down, by the stress current, another voltage on the another SRAM circuit path.

36. The method according to claim 33, wherein the stressing step further comprises:
self-stressing the memory cell by automatically creating and following the electrical path along components between the bit line and the complementary bit line that generally traverses from the high value to the low value depending on the values of the bit line and the complementary bit line.

* * * * *